(12) United States Patent
Nguyen et al.

(10) Patent No.: US 12,063,760 B2
(45) Date of Patent: Aug. 13, 2024

(54) ELECTRONIC ASSEMBLY HAVING RETAINER WITH LIQUID COUPLING BODY ENGAGING AN ELECTRONIC MODULE AND ASSOCIATED METHODS

(71) Applicant: EAGLE TECHNOLOGY, LLC, Melbourne, FL (US)

(72) Inventors: Voi Nguyen, Oviedo, FL (US); Charles Weirick, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 170 days.

(21) Appl. No.: 17/933,869

(22) Filed: Sep. 21, 2022

(65) Prior Publication Data
US 2024/0098943 A1    Mar. 21, 2024

(51) Int. Cl.
| G06F 1/16 | (2006.01) |
|---|---|
| H05K 5/00 | (2006.01) |
| H05K 5/06 | (2006.01) |
| H05K 7/00 | (2006.01) |
| H05K 7/20 | (2006.01) |

(52) U.S. Cl.
CPC ......... *H05K 7/20781* (2013.01); *H05K 5/065* (2013.01)

(58) Field of Classification Search
CPC ........... H05K 7/20781; H05K 7/20263; H05K 7/20336; H05K 7/20881; H05K 7/20272; H05K 7/20563; H05K 7/20572; H05K 7/2049; H05K 7/20009; H05K 7/20545; H05K 7/1422; H05K 5/065
See application file for complete search history.

(56) References Cited

U.S. PATENT DOCUMENTS

| 4,277,815 | A * | 7/1981 | Skroupa | H05K 7/20563 361/802 |
|---|---|---|---|---|
| 5,424,916 | A * | 6/1995 | Martin | H05K 7/20636 361/698 |
| 7,324,336 | B2 * | 1/2008 | Vos | H05K 7/1404 165/104.33 |
| 9,426,931 | B2 * | 8/2016 | Kaplun | H05K 7/20272 |
| 9,839,116 | B2 * | 12/2017 | Kirk | H05K 7/1404 |
| 10,791,654 | B2 | 9/2020 | McCordic et al. | |
| 11,363,738 | B2 | 6/2022 | Thompson et al. | |
| 2009/0225510 | A1 * | 9/2009 | Biemer | H05K 7/20563 361/690 |
| 2011/0176867 | A1 * | 7/2011 | Mosier | F16B 2/14 403/409.1 |

(Continued)

*Primary Examiner* — Anthony M Haughton
(74) *Attorney, Agent, or Firm* — ALLEN, DYER, DOPPELT, + GILCHRIST, P.A. Attorneys at Law (57) ABSTRACT

An electronic assembly may include a chassis having electronic module mounting positions and respective electronic modules received in each electronic module mounting position. A respective retainer may be coupled between the chassis and each electronic module. Each retainer may include a retainer body coupled to the chassis, and a liquid coupling body carried by the retainer body and movable between retracted and extended positions permitting insertion and removal of the electronic module. The liquid coupling body may have a retainer liquid outlet and a retainer liquid inlet configured to engage a module liquid inlet and module liquid outlet, respectively, when moved from the retracted position to the extended position.

20 Claims, 6 Drawing Sheets

(56) References Cited

U.S. PATENT DOCUMENTS

| | | | |
|---|---|---|---|
| 2014/0314514 A1* | 10/2014 | Paquette | H05K 7/20545 411/75 |
| 2015/0208554 A1* | 7/2015 | Leigh | H05K 7/20754 165/80.3 |
| 2019/0380225 A1 | 12/2019 | Thompson et al. | |
| 2023/0349649 A1* | 11/2023 | Nguyen | H05K 7/20009 |
| 2023/0354559 A1* | 11/2023 | Nguyen | H05K 7/1425 |
| 2023/0363103 A1* | 11/2023 | Nguyen | H05K 7/20145 |
| 2023/0389218 A1* | 11/2023 | Fowler | H05K 7/20163 |

\* cited by examiner

ELECTRONIC ASSEMBLY HAVING RETAINER WITH LIQUID COUPLING BODY ENGAGING AN ELECTRONIC MODULE AND ASSOCIATED METHODS

FIELD OF THE INVENTION

The present invention relates to the field of electronic assemblies, and, more particularly, this invention relates to electronic assemblies having a chassis and electronic module with liquid cooling paths and related methods.

BACKGROUND OF THE INVENTION

As electronic packaging density and dissipated power requirements increase to achieve higher levels of electronic performance, the need for efficient thermal transport within electronic assemblies having electronic modules carrying printed circuit boards also increases. Even though electronic components are becoming smaller with greater processing capability, and operate at a much lower power, these two advantages may have the effect of increasing thermal density because circuit designers are expected to pack even more functionality into ever smaller circuit spaces, thus increasing heat generation and requiring more advanced cooling and thermal management.

Brute force heat transfer techniques involve forced air, active liquid cooling, and similar heat transport mechanisms to transport heat from sensitive electronic components to heat sinks or similar heat spreading devices. Some heat transfer systems even use composite structures, for example, annealed pyrolytic graphite (APG) embedded within metallic skins or heat pipes connected to spreader plates.

A new industry standard, however, encourages the increased use of liquid flow through (LFT) cooling to reduce dependence on conduction cooling using 3U and 6U plug-in modules and circuit cards having backplanes and configured for use in 3 rack or 6 rack units. The ANSI/VITA 48.2 mechanical form-factor standard leverages liquid flow through cooling for chassis architectures to provide increased thermal performance while mitigating risk to electronic modules carrying different electronic components. The liquid, normally ethylene glycol/water or propylene glycol/water, is isolated to cooling paths adjacent the circuit board and the electronic components, where there are no foreign object debris (FOD), contaminants or impingements to the airflow.

The VITA 48.2 AFT standard is directed to channeling the liquid through plug-in electronic modules and heat sinks that interface with a liquid manifold to reduce thermal resistances between the cooling liquid and the heat-generating electronic components and provide a common framework for original equipment manufacturer (OEM) chassis and electronic module manufacturers. State-of-the-art designs that implement the VITA 48.2 AFT technology, however, may have technical drawbacks because of the complexity due to liquid coming in through the backplane. Additionally, the mating of various components in current designs takes up valuable input/output design space for modules, increases fluid manifold complexity, and complicates final assembly of electronic components and plug-in modules.

SUMMARY OF THE INVENTION

In general, an electronic assembly may comprise a chassis having a plurality of electronic module mounting positions. A respective electronic module may be received in each electronic module mounting position and may have a module liquid inlet and a module liquid outlet. A respective retainer may be coupled between the chassis and each electronic module and may comprise a retainer body coupled to the chassis, and a liquid coupling body carried by the retainer body and movable between retracted and extended positions permitting insertion and removal of the electronic module. The liquid coupling body may have a retainer liquid outlet and a retainer liquid inlet configured to engage the module liquid inlet and module liquid outlet, respectively, when moved from the retracted position to the extended position.

The module liquid outlet and module liquid inlet may comprise a module female liquid outlet and a module female liquid inlet, respectively. The retainer liquid inlet and retainer liquid outlet may comprise a retainer male liquid inlet and a retainer male liquid outlet, respectively. The module female liquid outlet and corresponding retainer male liquid inlet may define a first quick disconnect coupling and the module female liquid inlet and corresponding retainer male liquid outlet may define a second quick disconnect coupling.

In an example, a drive member may be coupled to move the liquid coupling body between the retracted and extended positions. The drive member may comprise a threaded shaft and at least one wedge carried thereby. At least one guide pin may be coupled between the retainer body and the liquid coupling body. Each electronic module may comprise a circuit board having a liquid cooling path associated therewith. The electronic module may comprise a backplane connector carried by the circuit board along a back edge thereof. The retainer may be adjacent a side of the circuit board. The chassis may comprise a plurality of electronic module mounting rails to slidably receive each electronic module.

Another aspect is directed to a method of mounting an electronic module in a chassis using a retainer. The electronic module may have a module liquid inlet and a module liquid outlet. The method may comprise coupling a retainer body to the chassis and moving a liquid coupling body carried by the retainer body from a retracted position to an extended position. The liquid coupling body may have a retainer liquid outlet and a retainer liquid inlet engaging the module liquid inlet and module liquid outlet, respectively, when moved from the retracted position to the extended position.

BRIEF DESCRIPTION OF THE DRAWINGS

Other objects, features and advantages of the present invention will become apparent from the Detailed Description of the invention which follows, when considered in light of the accompanying drawings in which.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

Figure 1:
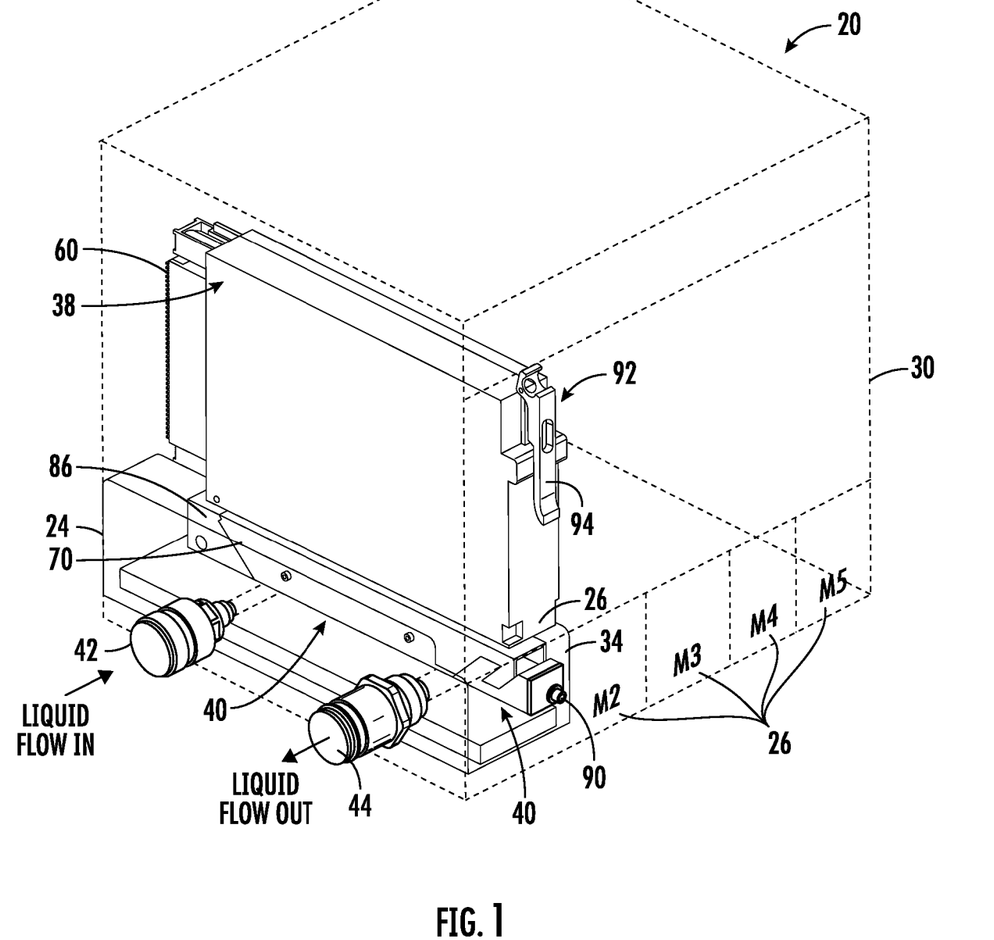
FIG. 1 is an isometric view of the electronic assembly showing a retainer coupled between the chassis and electronic module.
Figure 2:
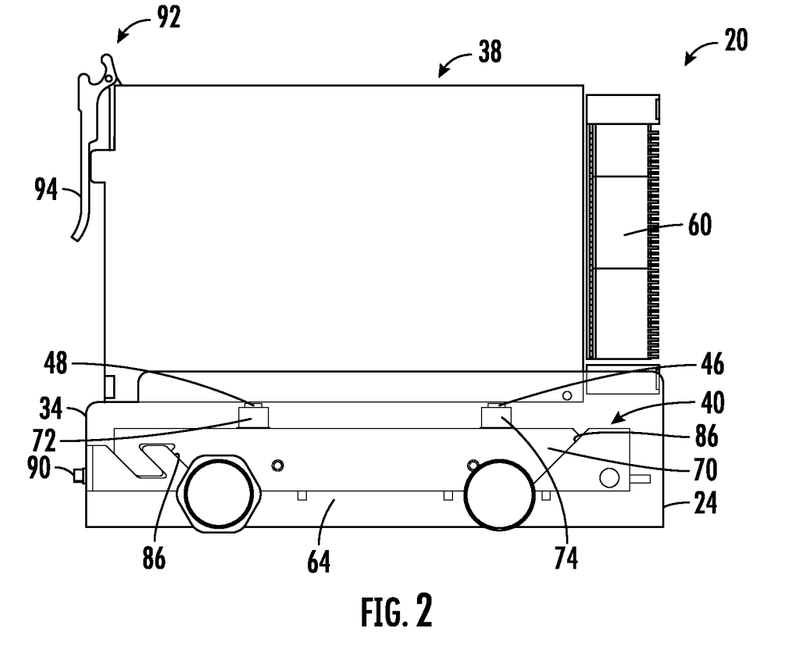
FIG. 2 is a fragmentary, partial sectional view of the electronic assembly showing the liquid coupling body carried by the retainer body and in a retracted position.
Figure 3:
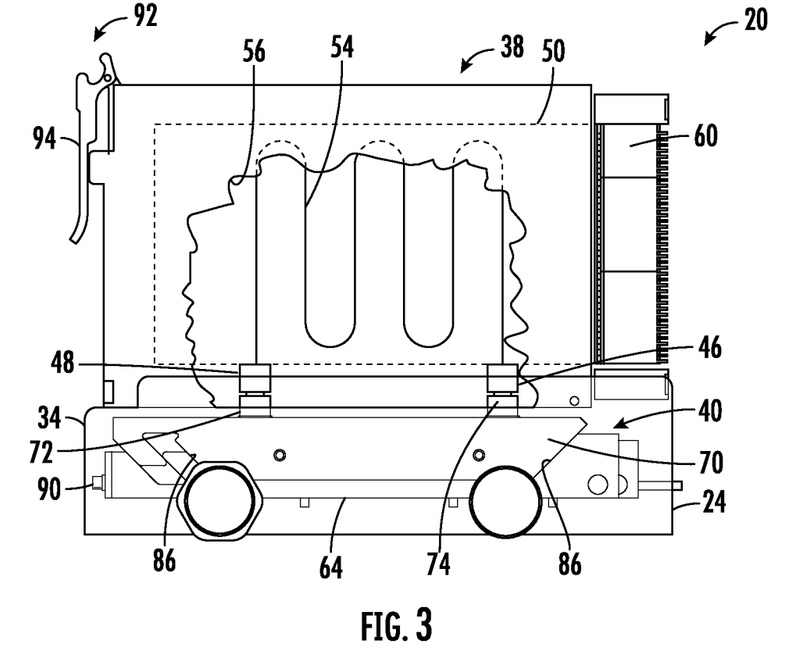
FIG. 3 is another fragmentary, partial sectional view of the electronic assembly showing the liquid coupling body in the extended position.
Figure 4:
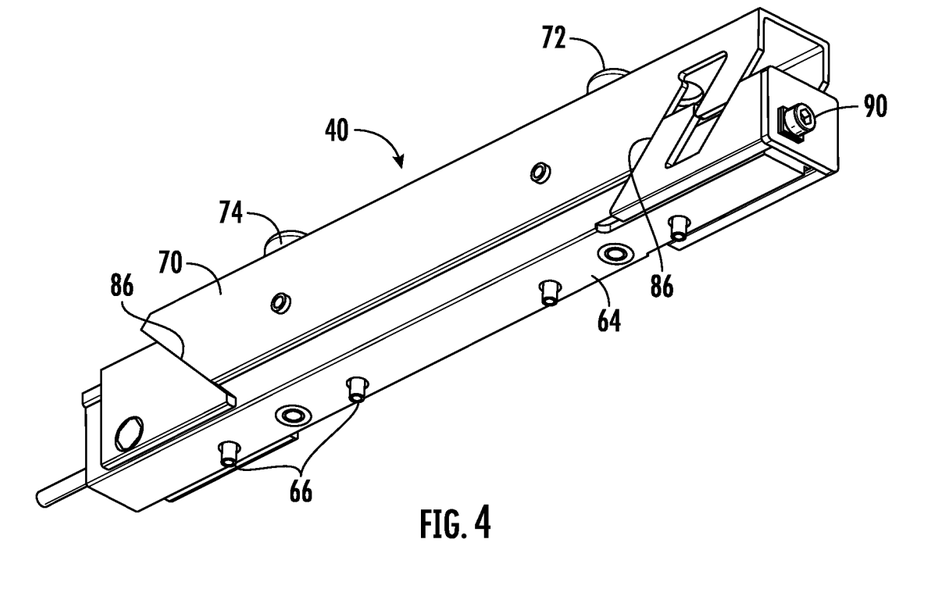
FIG. 4 is a bottom isometric view of the retainer and its retainer body and liquid coupling body.
Figure 5:
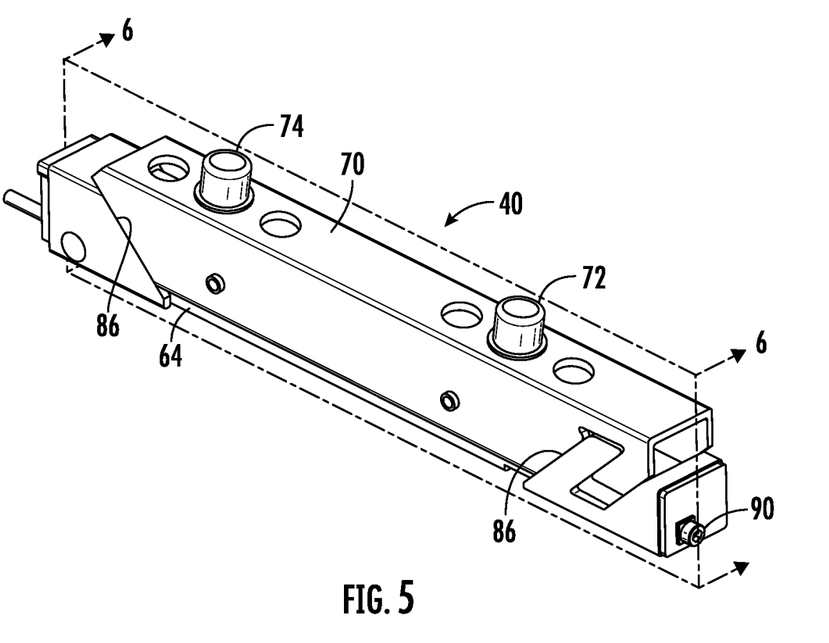
FIG. 5 is a top isometric view of the retainer and its retainer body and liquid coupling body.

Referring initially to FIGS. 1-3, an electronic assembly is shown generally at 20 and includes a chassis 24 having a plurality of electronic module mounting positions 26 as best shown in FIG. 1. The electronic assembly 20 illustrated in FIG. 1 does not show its complete sidewalls and other structural members for the chassis 24 in detail. Portions of the sidewalls and other structural members of the chassis 24 are outlined by the dashed lines at 30 for purposes of illustrating the configuration of the electronic assembly 20. The chassis 24 includes a plurality of electronic module mounting rails 34 at each electronic module mounting position 26 that slidably receive a respective electronic module 38 as shown in FIGS. 1-3. For purposes of illustration in FIG. 1, only one electronic module 38 is shown received in the first electronic module mounting position 26, leaving four remaining electronic module mounting positions shown by the legend M2, M3, M4 and M5, which each mount an electronic module. Cooling liquid may flow upward into an electronic module 38 via a respective retainer 40 coupled between the chassis 24 and the electronic module positioned in the respective electronic module mounting position 26.

The chassis 24 includes a liquid supply line 42 and a liquid discharge line 44 that extend transverse across the chassis and supply and return cooling liquid to and from retainers 40 coupled between the chassis and each electronic module 38 mounted in a respective electronic module mounting position 26. Each electronic module 38 has a module liquid inlet 46 and module liquid outlet 48, and a circuit board 50 having a liquid cooling path 54 as part of a liquid manifold and shown by the dashed lines in the breakaway cut-out section 56 of FIG. 3 that also shows a portion of the circuit board. The liquid cooling path 54 is associated with the circuit board 50 and allows the cooling liquid received in the module liquid inlet 46 to flow through the respective electronic module 38 and cool any electronic components on the circuit board 50. After cooling, the cooling liquid flows from the module liquid outlet 48. Each electronic module 38 also includes a backplane connector 60 carried by the circuit board 50 along a back edge thereof and connects into a backplane of the electronic assembly 20, such as 3U or 6U chassis designs as non-limiting examples. The retainer 40 receives and supplies the cooling liquid via the module liquid inlet 46 and module liquid outlet 48 with the electronic module 38. The retainer 40 is mounted adjacent a side of the electronic module 38 and circuit board 50 as shown in FIG. 3, showing the electronic module in partial cut-away and the cooling path 54 associated with the circuit board.

Figure 6:
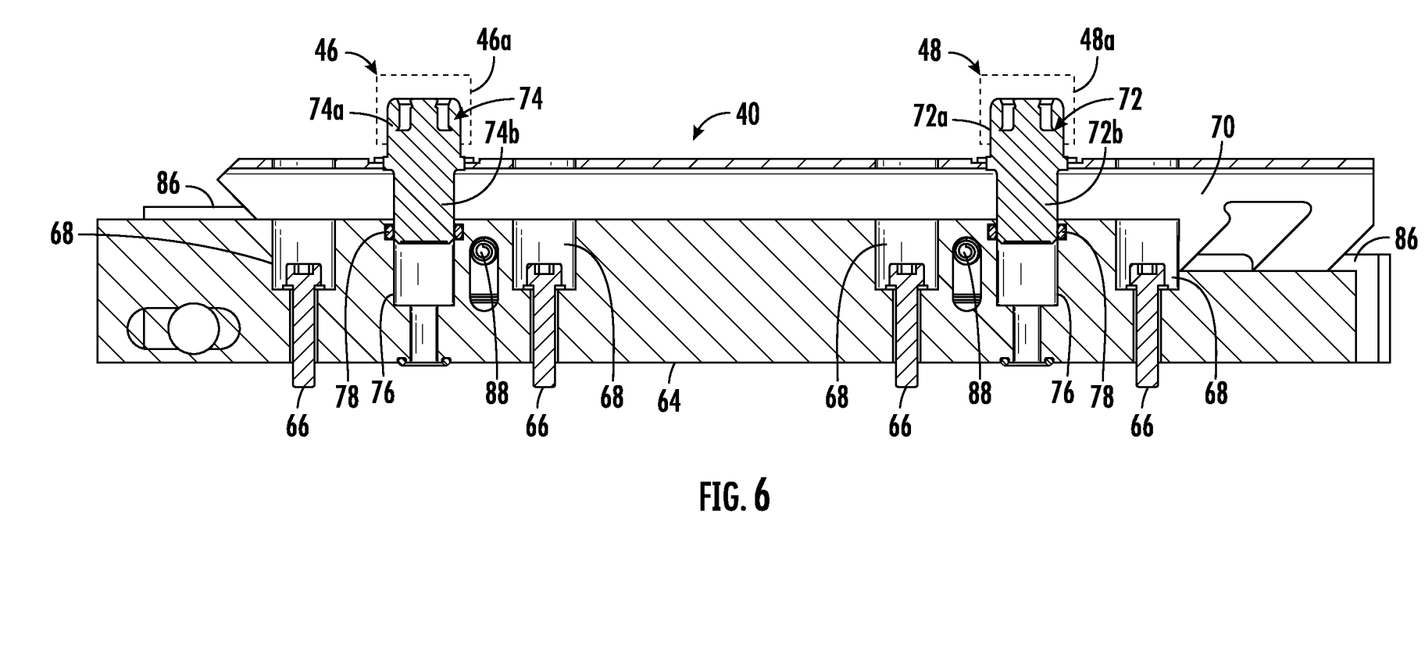
FIG. 6 is a sectional view of the retainer taken along line 6-6 of FIG. 5.
Figure 7:
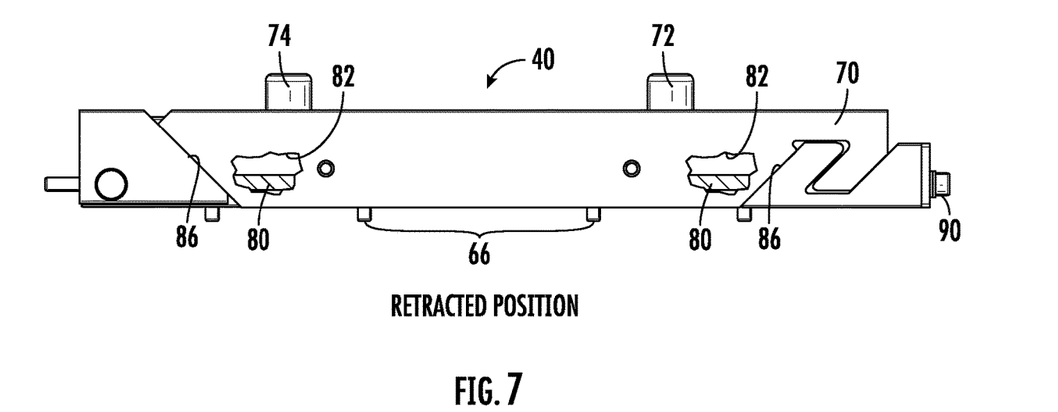
FIG. 7 is a side elevation view of the retainer showing the liquid coupling body in the retracted position.
Figure 8:
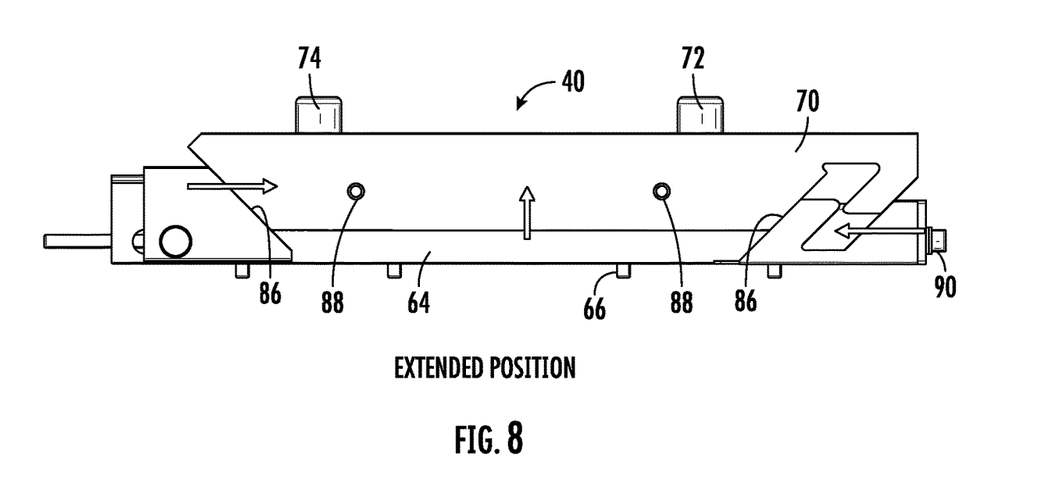
FIG. 8 is another side elevation view of the retainer showing the liquid coupling body in the extended position.

The retainer 40 that is coupled between the chassis 24 and an electronic module 38 includes a retainer body 64 coupled to the chassis via fasteners 66 such as screws that extend into countersunk orifices 68 and into the chassis to hold firm the retainer body onto the chassis at an electronic module mounting position 26 (FIG. 6). A liquid coupling body 70 is carried by the retainer body 64 and movable between retracted and extended positions as shown in FIGS. 2 and 3, permitting insertion and removal of an electronic module 38 at an electronic module mounting position 26. The liquid coupling body 70 has a retainer liquid inlet 72 and a retainer liquid outlet 74 configured to engage the module liquid outlet 48 and module liquid inlet 46, respectively, and move from the retracted position (FIGS. 2 and 7) to the extended position (FIGS. 3 and 8).

The module liquid outlet 48 and module liquid inlet 46 are formed at their ends as a module female liquid outlet 48a and a module female liquid inlet 46a, respectively (FIG. 6). The retainer liquid inlet 72 and retainer liquid outlet 74 are formed at their ends as a retainer male liquid inlet 72a and a retainer male liquid outlet 74a, respectively, and engage the module female liquid outlet 48a and module female liquid inlet 46a when the liquid coupling body 70 is moved from the retracted position to the extended position as best shown in FIGS. 2 and 3. The male and female configuration helps the module liquid inlets and outlets 46, 48 engage the retainer liquid outlets and inlets 74,72.

Each retainer liquid inlet 72 and retainer liquid outlet 74 includes a respective lower cylindrical body member 72b, 74b received within a cylindrical orifice 76 at the top section of the retainer body 64 and includes a seal 78 to prevent fluid from passing out from the retainer body 64 when the liquid coupling body 70 moves from the retracted position to the extended position as also shown in the sectional view of FIG. 6. The module female liquid outlet 48a and corresponding retainer male liquid inlet 72a define a first quick disconnect coupling and the module female liquid inlet 46a and corresponding retainer male liquid outlet 74a define a second quick disconnect coupling (FIG. 6).

Each retainer 40 includes a drive member 80 coupled to move the liquid coupling body 70 between the retracted and extended positions. The drive member 80 is formed as a threaded shaft as shown in the cut-out section illustrated at 82 in FIG. 7. At least one wedge 86 is carried by the drive member 80 as the threaded shaft. In the example shown in FIGS. 1-8, a wedge 86 is positioned at the end of the retainer body 64. Each end of the threaded shaft as the drive member 80 is connected to a wedge 86. As the threaded shaft 80 is rotated, the inclined or sloped sides of the wedges 86 engage sloped segments of the liquid coupling body 70 and move the liquid coupling body upward relative to the retainer body 64. The structure of the wedges 86, retainer body 64, and liquid coupling body 70 allows the liquid coupling body to extend upward in a vertical direction from the retainer body and facilitate the retainer liquid outlet 74 and retainer liquid inlet 72 engaging the respective module liquid inlet 46 and module liquid outlet 48, respectively, when the liquid coupling body 70 is moved from the retracted position to its extended position. This provides a sealed connection, without leakage of cooling liquid onto electronic components on the circuit board 50 or into the chassis 24 but retained within the cooling path 54.

At least one guide pin 88 is coupled between the retainer body 64 and the liquid coupling body 70 to help guide and maintain the liquid coupling body 70 in its vertical upward alignment to allow precision guidance and alignment of the retainer male liquid inlet 72*a* with the corresponding module female liquid outlet 48*a* and the module female liquid inlet 46*a* with the retainer male liquid outlet 74*a*. In an example shown in FIG. 6, two guide pins 88 are illustrated.

A retainer 40 and its retainer body 64 and liquid coupling body 70 may be formed from different materials, including rigid plastic or metallic materials. The retainer liquid outlet 74 and retainer liquid inlet 72 and module liquid inlet 46 and module liquid outlet 48 that define the first quick disconnect coupling and second quick disconnect coupling may also be formed from plastic or metallic materials, although metallic materials are usually used to form quick disconnect couplings. The rotational drive member 80 may include a removable drive head 90 coupled to a first end of the threaded shaft.

Each retainer body 64 has an elongate, generally rectangular shape and fits within the chassis 24 at each electronic module mounting position 26, which includes vertical walls forming the electronic module mounting rails 34. The removable drive head 90 as part of the rotational drive member 80 is removed when the retainer 40 is initially inserted within the electronic module mounting position 26. The removable drive head 90 is inserted back onto the rotational drive member 80 after the retainer 40 is installed.

In operation, a retainer 40 is first positioned within an electronic module mounting position 26 within the chassis 24 when the drive head 90 has been removed. After the retainer 40 is seated and secured by the fasteners 66 within the electronic module mounting position 26, the removable drive head 90 is inserted into an orifice positioned at the sidewall of the chassis 24 at the electronic mounting position 26 to engage the threaded shaft of the drive member 80. This permits rotation of the threaded shaft via the removable drive head 90, and thus, retract or extend the liquid coupling body 70 upon rotation of the removable drive head 90.

Referring again to FIGS. 1-3, the electronic module 38 includes a locking mechanism 92 configured as a pivoting finger grip 94, which engages a slot formed in the chassis 24 when the electronic module is fully received in an electronic module mounting position 26 to lock the electronic module in that position. This helps ensure that the retainer liquid outlet 74 and retainer liquid inlet 72 remain aligned with the module liquid inlet 46 and module liquid outlet 48.

Figure 9:
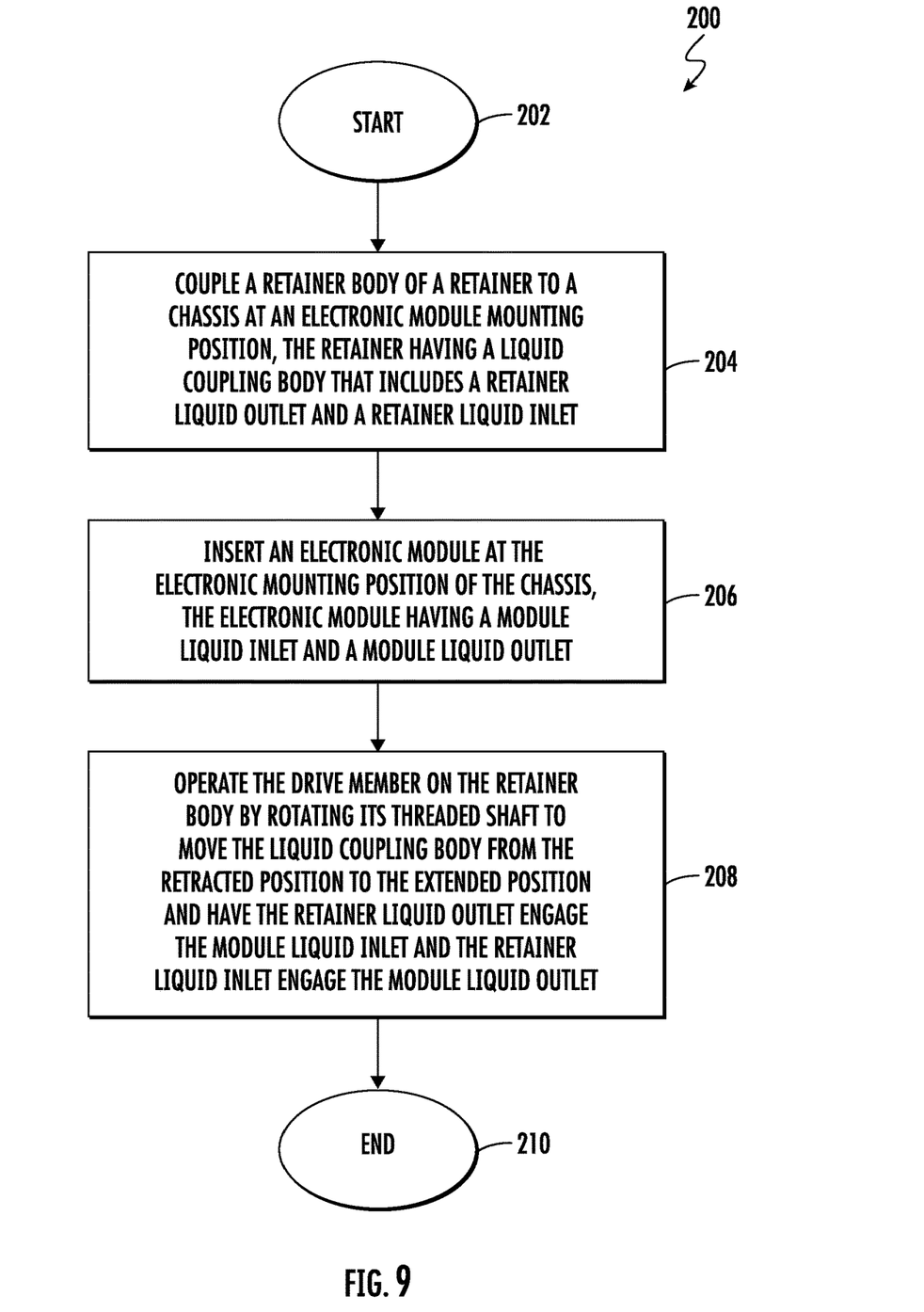
FIG. 9 is a high-level flowchart showing a method of mounting an electronic module in the chassis.

Referring now additionally to FIG. 9, there is illustrated a high-level flowchart of a method of mounting an electronic module 38 in the electronic module mounting position 26 of the chassis 24, which method is illustrated generally at 200. The process starts (Block 202) and a retainer body 64 of a retainer 40 is coupled to the chassis 24 at an electronic module mounting position 26 (Block 204). The retainer 40 includes a liquid coupling body 70 having its retainer liquid outlet 74 and retainer liquid inlet 72. An electronic module 38 is inserted at the electronic mounting position 26 of the chassis 24 such as by sliding on the electronic module mounting rails 34 (Block 206). The electronic module 38 has a module liquid inlet 46 and a module liquid outlet 48.

The drive member 80 of the retainer body 64 is operated by rotating its threaded shaft to move the liquid coupling body 70 from the retracted position to the extended position and have the retainer liquid outlet 74 engage the module liquid inlet 46 and the retainer liquid inlet 72 engage the module liquid outlet 48 (Block 208). The process ends (Block 210).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An electronic assembly comprising:
   a chassis having a plurality of electronic module mounting positions;
   a respective electronic module received in each electronic module mounting position and having a module liquid inlet and a module liquid outlet; and
   a respective retainer coupled between the chassis and each electronic module comprising
      a retainer body coupled to the chassis, and
      a liquid coupling body carried by the retainer body and movable between retracted and extended positions permitting insertion and removal of the electronic module, the liquid coupling body having a retainer liquid outlet and a retainer liquid inlet configured to engage the module liquid inlet and module liquid outlet, respectively, when moved from the retracted position to the extended position.

2. The electronic assembly of claim 1 wherein the module liquid outlet and module liquid inlet comprise a module female liquid outlet and a module female liquid inlet, respectively; and wherein the retainer liquid inlet and retainer liquid outlet comprise a retainer male liquid inlet and a retainer male liquid outlet, respectively.

3. The electronic assembly of claim 2 wherein the module female liquid outlet and corresponding retainer male liquid inlet define a first quick disconnect coupling; and wherein the module female liquid inlet and corresponding retainer male liquid outlet define a second quick disconnect coupling.

4. The electronic assembly of claim 1 comprising a drive member coupled to move the liquid coupling body between the retracted and extended positions.

5. The electronic assembly of claim 4 wherein the drive member comprises a threaded shaft and at least one wedge carried thereby.

6. The electronic assembly of claim 1 comprising at least one guide pin coupled between the retainer body and the liquid coupling body.

7. The electronic assembly of claim 1 wherein each electronic module comprises a circuit board having a liquid cooling path associated therewith.

8. The electronic assembly of claim 7 wherein the electronic module comprises a backplane connector carried by the circuit board along a back edge thereof; and wherein the retainer is adjacent a side of the circuit board.

9. The electronic assembly of claim 1 wherein the chassis comprises a plurality of electronic module mounting rails to slidably receive each electronic module.

10. A retainer to be coupled between a chassis and an electronic module, the chassis having a plurality of electronic module mounting positions, a respective electronic module to be mounted in each mounting position and having a module liquid inlet and a module liquid outlet, the retainer comprising:
   a retainer body to be coupled to the chassis; and
   a liquid coupling body carried by the retainer body and movable between retracted and extended positions permitting insertion and removal of the electronic module, the liquid coupling body having a retainer liquid outlet and a retainer liquid inlet configured to engage the module liquid inlet and module liquid outlet, respectively, when moved from the retracted position to the extended position.

11. The retainer of claim 10 wherein the module liquid outlet and module liquid inlet comprise a module female liquid outlet and a module female liquid inlet, respectively; and wherein the retainer liquid inlet and retainer liquid outlet comprise a retainer male liquid inlet and a retainer male liquid outlet, respectively.

12. The retainer of claim 11 wherein the module female liquid outlet and corresponding retainer male liquid inlet define a first quick disconnect coupling; and wherein the module female liquid inlet and corresponding retainer male liquid outlet define a second quick disconnect coupling.

13. The retainer of claim 10 comprising a drive member coupled to move the liquid coupling body between the retracted and extended positions.

14. The retainer of claim 13 wherein the drive member comprises a threaded shaft and at least one wedge carried thereby.

15. The retainer of claim 10 comprising at least one guide pin coupled between the retainer body and the liquid coupling body.

16. A method of mounting an electronic module in a chassis using a retainer, the electronic module having a module liquid inlet and a module liquid outlet, the method comprising:

coupling a retainer body to the chassis; and moving a liquid coupling body carried by the retainer body from a retracted position to an extended position, the liquid coupling body having a retainer liquid outlet and a retainer liquid inlet engaging the module liquid inlet and module liquid outlet, respectively, when moved from the retracted position to the extended position.

17. The method of claim 16 wherein the module liquid outlet and module liquid inlet comprise a module female liquid outlet and a module female liquid inlet, respectively; and wherein the retainer liquid inlet and retainer liquid outlet comprise a retainer male liquid inlet and a retainer male liquid outlet, respectively.

18. The method of claim 17 wherein the module female liquid outlet and corresponding retainer male liquid inlet define a first quick disconnect coupling; and wherein the module female liquid inlet and corresponding retainer male liquid outlet define a second quick disconnect coupling.

19. The method of claim 16 comprising operating a drive member to move the liquid coupling body from the retracted position to the extended position.

20. The method of claim 19 wherein the drive member comprises a threaded shaft and at least one wedge carried thereby.

* * * * *